United States Patent
Lee (10) Patent No.: US 7,235,864 B2
(45) Date of Patent: Jun. 26, 2007

(54) INTEGRATED CIRCUIT DEVICES, EDGE SEALS THEREFOR

(75) Inventor: Tze-Liang Lee, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 308 days.

(21) Appl. No.: 11/002,098

(22) Filed: Dec. 3, 2004

(65) Prior Publication Data

US 2005/0151239 A1    Jul. 14, 2005

(30) Foreign Application Priority Data

Jan. 14, 2004  (TW) .............................. 93100873 A (51) Int. Cl.
*H01L 23/544* (2006.01)
(52) U.S. Cl. ............................ 257/620; 257/E23.137
(58) Field of Classification Search ................. 257/620
See application file for complete search history.

(56) References Cited

U.S. PATENT DOCUMENTS

| | | | | |
|---|---|---|---|---|
| 5,834,829 A | * | 11/1998 | Dinkel et al. ............... | 257/620 |
| 6,022,791 A | * | 2/2000 | Cook et al. .................. | 438/458 |
| 6,365,958 B1 | * | 4/2002 | Ibnabdeljalil et al. ....... | 257/620 |
| 6,495,918 B1 | * | 12/2002 | Brintzinger .................. | 257/758 |
| 6,521,975 B1 | * | 2/2003 | West et al. .................. | 257/620 |
| 6,605,861 B2 | * | 8/2003 | Toyoda ........................ | 257/620 |
| 6,806,168 B2 | * | 10/2004 | Towle et al. ................. | 438/460 |
| 6,841,455 B2 | * | 1/2005 | West et al. .................. | 438/462 |
| 6,861,755 B2 | * | 3/2005 | Hosoda et al. .............. | 257/758 |
| 6,876,062 B2 | * | 4/2005 | Lee et al. .................... | 257/622 |
| 6,876,064 B2 | * | 4/2005 | Matumoto et al. .......... | 257/632 |
| 6,998,712 B2 | * | 2/2006 | Okada et al. ............... | 257/758 |
| 7,087,452 B2 | * | 8/2006 | Joshi et al. .................... | 438/68 |
| 7,129,565 B2 | * | 10/2006 | Watanabe et al. ........... | 257/620 |
| 2001/0005617 A1 | * | 6/2001 | Feurle et al. ............... | 438/460 |
| 2004/0084777 A1 | * | 5/2004 | Yamanoue et al. ......... | 257/758 |
| 2006/0012012 A1 | * | 1/2006 | Wang et al. ................ | 257/620 |

\* cited by examiner

*Primary Examiner*—David A. Zarneke
(74) *Attorney, Agent, or Firm*—Birch, Stewart, Kolasch & Birch, LLP (57) ABSTRACT

An edge seal for a chip with integrated circuits. A first metal line extends along a periphery of the chip, with a first inter-metal dielectric layer on the first metal line. A second metal line overlies the first inter-metal dielectric layer and extends along the periphery of the chip. A plurality of first metal plugs in the first inter-metal dielectric layer connects the first metal line and the second metal line and at least one first metal wall in the first inter-metal dielectric layer is laterally adjacent to a periphery of the first metal line.

39 Claims, 12 Drawing Sheets

INTEGRATED CIRCUIT DEVICES, EDGE SEALS THEREFOR

BACKGROUND

The present invention relates to integrated circuits, more particularly, to edge seals for chips.

Edge seals for chips are generally used as mechanical and electrical barriers to contamination introduced in the chip sawing process.

Figure 1:
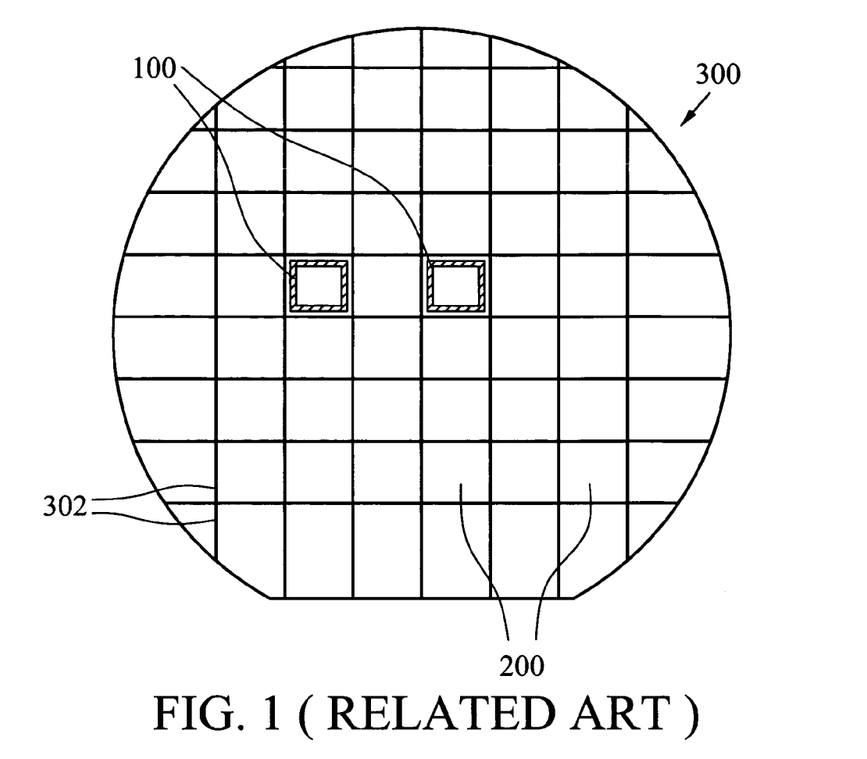
FIG. 1 is a top view of a semiconductor wafer with an edge seal along the edges of the chips.

FIG. 1 shows a semiconductor wafer 300 with a plurality of semiconductor chips 200 arranged in an array. Each semiconductor chip 200 contains circuitry to perform a specific function and has an edge seal 100 disposed along the edge thereof to prevent contamination by moisture and metal particles. Scribe lines 302 are arranged between semiconductor chips 200 where a saw can pass when separating the semiconductor chip.

Figure 2:
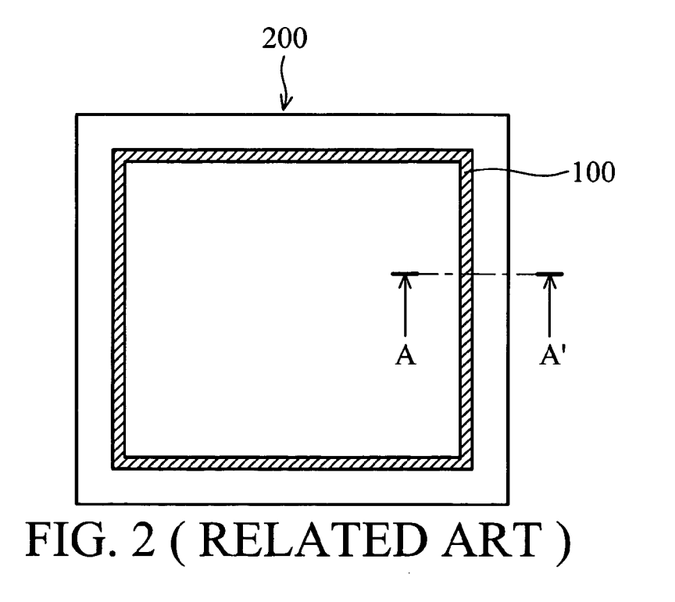
FIG. 2 is a top view of a semiconductor chip having a conventional edge seal.
Figure 3:
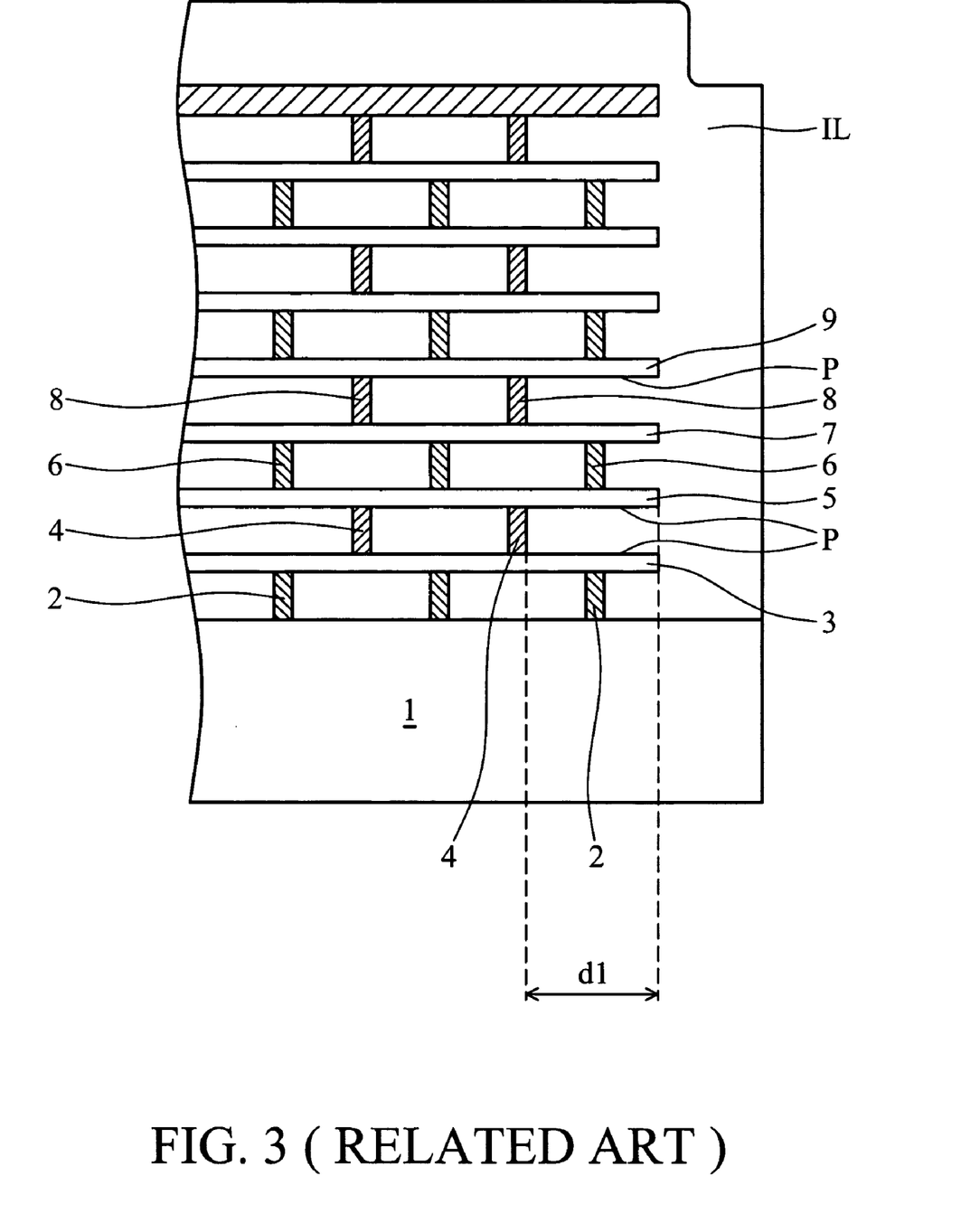
FIG. 3 is a cross sectional view along line A–A' of FIG. 2.

FIG. 2 is a top view of semiconductor chip 200 comprising the edge seal 100 and FIG. 3 is a cross sectional view taken along line A–A' of showing a dielectric layer IL on a semiconductor wafer 1 with a plurality of tungsten plugs 2 and metal lines 3, 5, 7, 9 of copper in the dielectric layer IL. Metal lines 3, 5, 7, and 9 are approximately parallel. A plurality of metal walls 4 are disposed between metal lines 3 and 5 comprising a plurality of trenches filled with a copper layer.

A plurality of metal walls 6 are disposed between the metal lines 5 and 7 with a plurality of metal walls 8 between metal lines 7 and 9. Metal walls 4, 6 on adjacent metal lines are staggered in the dielectric layer IL. Metal walls 6, 8 on the adjacent metal lines are also staggered and disposed in the dielectric layer IL.

Distance d1 between the metal wall 4 and the edges of metal lines 3 or 5 is large enough that delimitation P may occur at the dielectric layer IL at the edges of the metal lines 3 or 5 by thermal stress during packaging or test process.

SUMMARY

In view of the above disadvantages, edge seals for chips to protect integrated circuits and integrated circuit devices using the edge seals are provided. Embodiments of such edge seals comprise a first metal line, a first inter-metal dielectric layer, a second metal line, a plurality of first metal plugs and at least one first metal wall. The first metal line extends along a periphery of the chip. The first inter-metal dielectric layer is on the first metal line. The second metal line overlies the first inter-metal dielectric layer and extends along the periphery of the chip. The first metal plugs in the first inter-metal dielectric layer connect the first and second metal line. The first metal wall in the first inter-metal dielectric layer is laterally adjacent to a periphery of the first metal line, in which the first metal wall is connected to the first metal line and the second metal line.

The first metal wall is separated by less than one micron from the periphery of the first metal line.

Alternately, an embodiment of an edge seal may comprise a plurality of inter-metal dielectric layers, a plurality of metal lines, a plurality of metal plugs in the inter-metal dielectric layers and a plurality of metal walls formed in the inter-metal dielectric layers, with each of the metal walls adjacent to a periphery of the metal plugs and connecting adjacent metal lines. Also, each metal line on the inter-metal dielectric layers extends along a periphery of the chip. Each of the metal plugs in the same inter-metal dielectric layer connects adjacent metal lines. Each of the metal walls in the same inter-metal dielectric layer adjacent to a periphery of the metal lines preferably connects adjacent metal lines. The metal plugs are preferably arranged in an array in each of the inter-metal dielectric layers with the metal plugs in each of the inter-metal dielectric layers preferably aligned with those in adjacent inter-metal dielectric layers. Alternately, the metal walls formed in the adjacent inter-metal dielectric layers are substantially aligned with each other.

Also, provided are embodiments of integrated circuit devices utilizing the edge seals.

DESCRIPTION OF THE DRAWINGS

The disclosure can be more fully understood with reference to the following drawings.

FIG. 5b is top view of inter-layer metal plugs and inter-layer metal walls of the edge seal in FIG. 5a.

FIG. 5d is an enlarged sectional perspective view of FIG. 5a.

DETAILED DESCRIPTION

Figure 4:
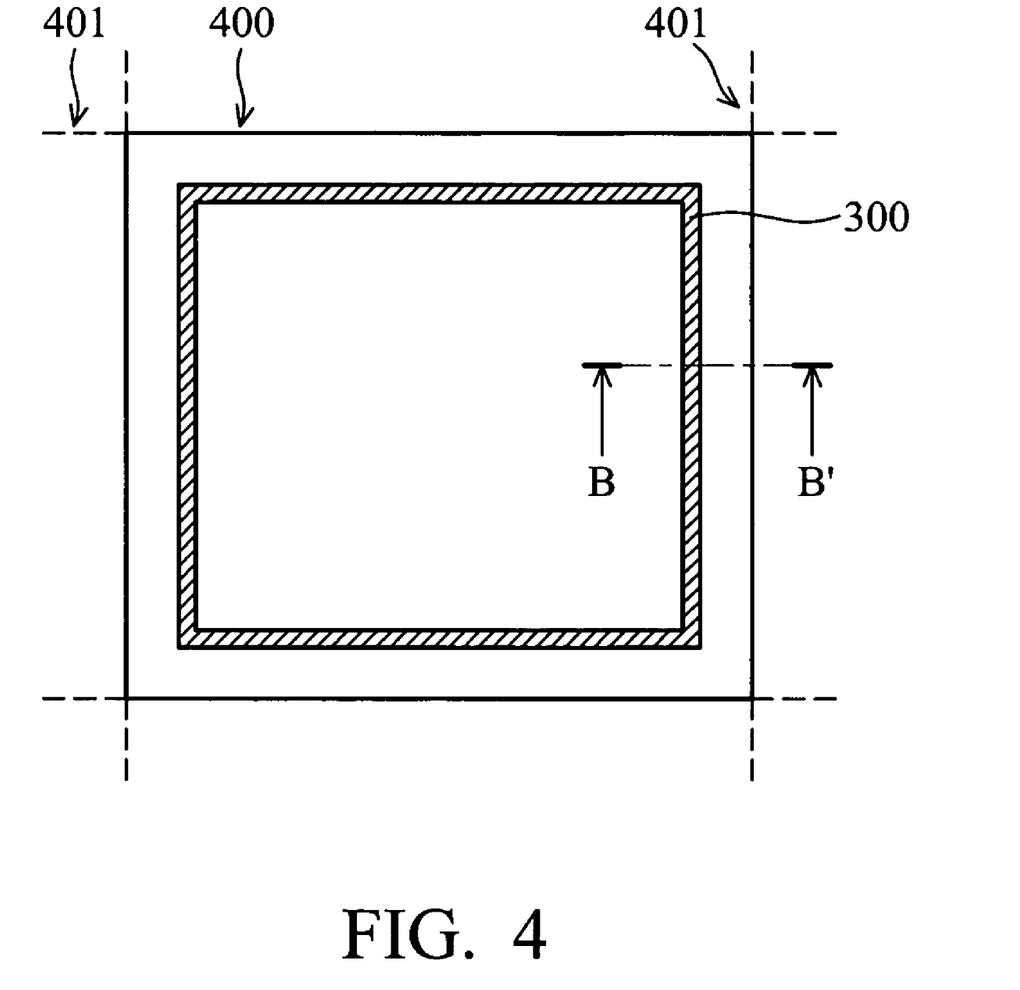
FIG. 4 is a top view of an embodiment of a semiconductor chip with an edge seal thereon.

FIG. 4 is a top view of an embodiment of an integrated circuit device, a semiconductor chip 400, with an edge seal 300 therein sawn from a wafer along a scribe line 401.

Figure 5A:
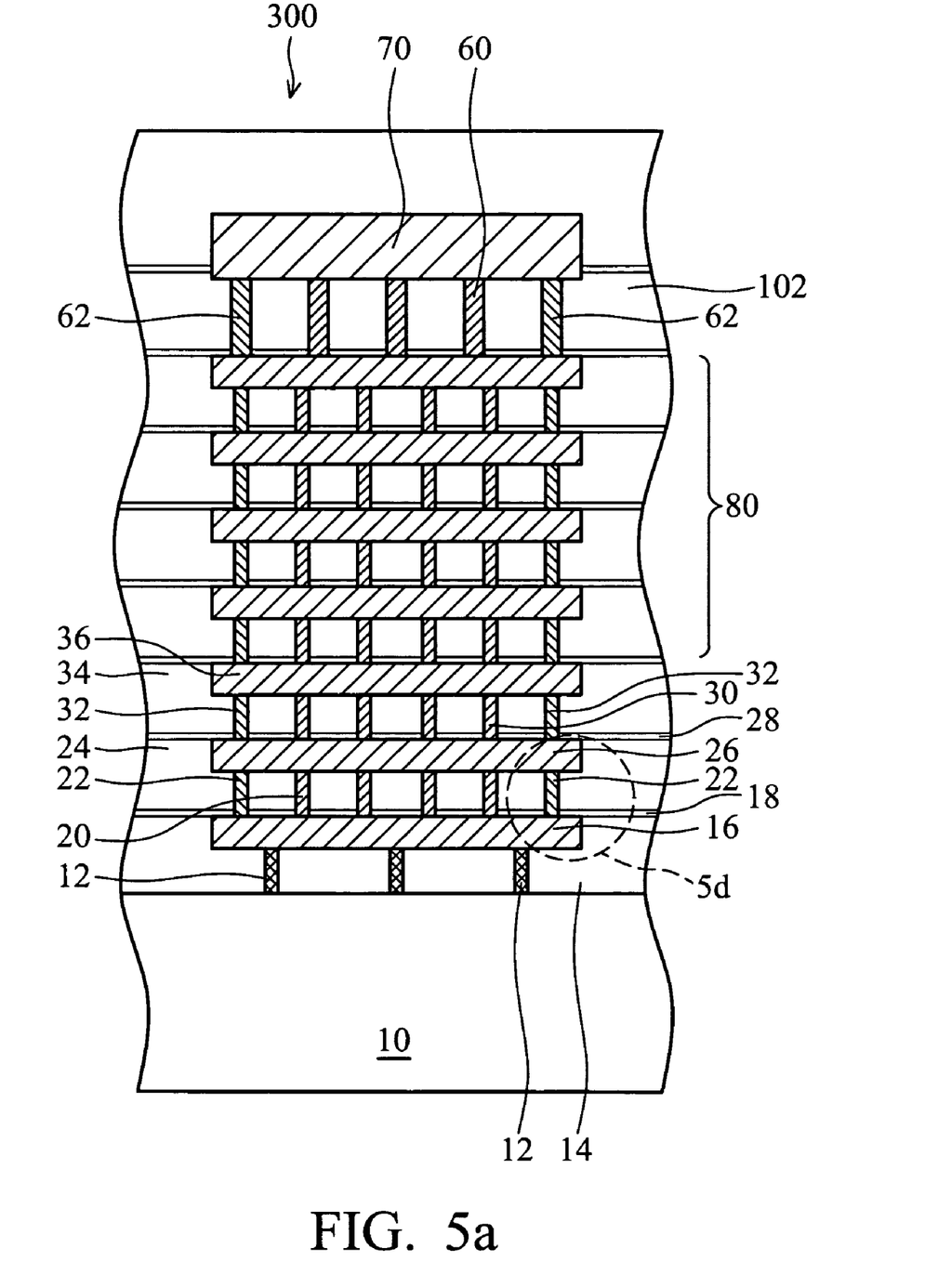
FIG. 5a is a cross sectional view taken along line B–B' of FIG. 4.
Figure 5B:
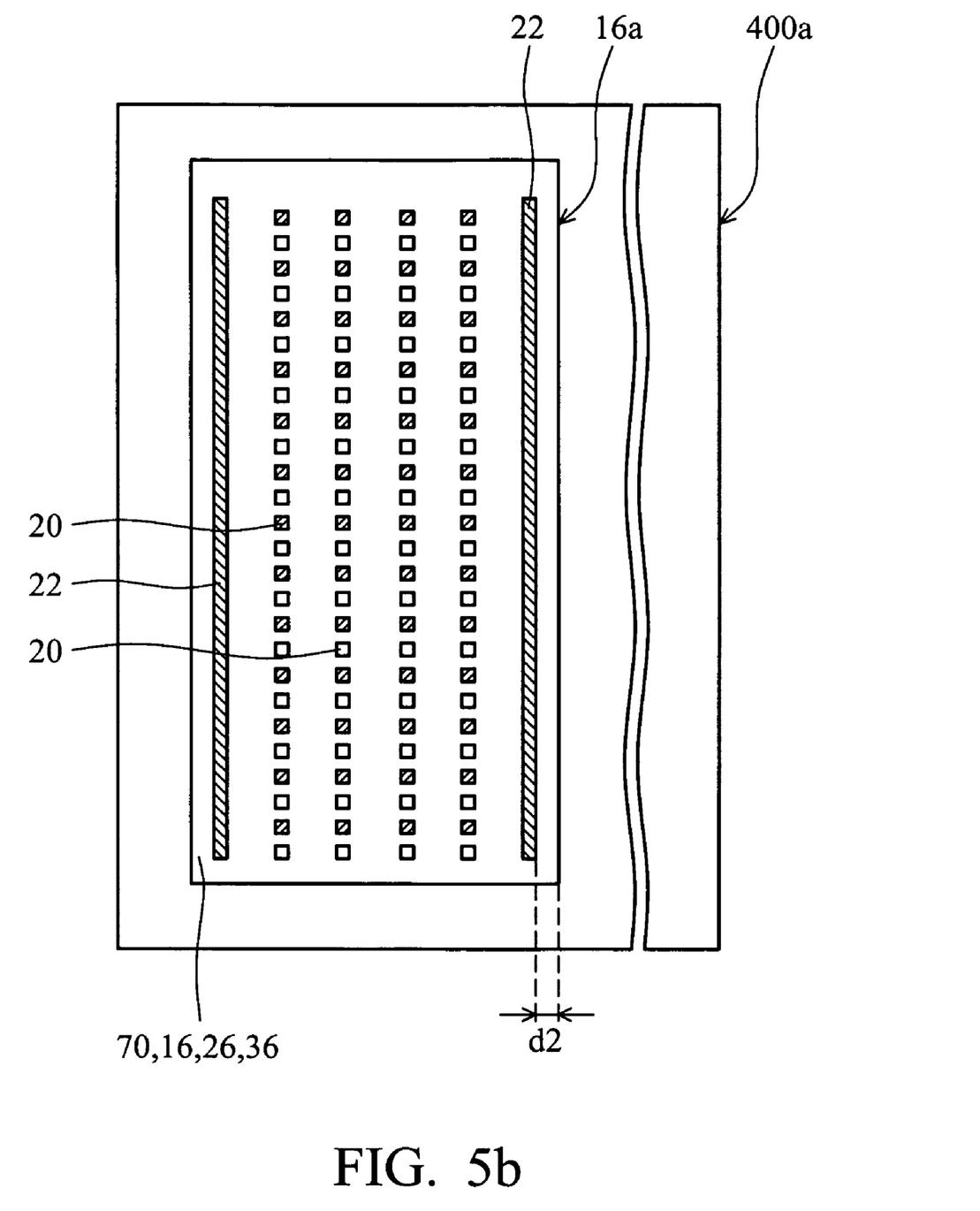

As shown in FIG. 5a, a semiconductor wafer 10 has a dielectric layer 14 thereon. The dielectric layer 14 comprises a material with a dielectric constant less than 3.2, for example a polymer based dielectric or an inorganic material such as a carbon-doped oxide. A plurality of tungsten plugs 12 and a first metal line 16 comprising copper are within the dielectric layer 14. As shown in FIG. 5e, the first metal line 16 is a rectangular ring extending along the periphery 400a of the semiconductor chip 400.

A first etching stop layer 18 of silicon nitride, is on the first metal line 16 and the dielectric layer 14. A first inter-metal dielectric layer 24, having a dielectric constant less than 3.2, is disposed on the first etching stop layer 18 such that the first etching stop layer 18 is between the first metal line 16 and the first inter-metal dielectric layer 24. Furthermore, the first etching stop layer 18 acts as an end point during etching of first inter-metal dielectric layer 24 to form via holes for metal plugs and via trenches for metal walls.

A plurality of first metal plugs 20, consisting of copper, in the first inter-metal dielectric layer 24 are vertically separated from each other by the first inter-metal dielectric layer 24. First metal walls 22 in the first inter-metal dielectric layer 24 are laterally adjacent to a periphery 16a of the first metal line 16 as shown in FIG. 5b. Moreover, each of the first metal walls 22 is separated by a distance d2 less than 1 micron from the periphery 16a of the first metal line 16.

First metal plugs 20 and first metal walls 22 comprise a copper layer in the via holes and the trenches described above.

First metal plugs 20 are disposed in the first inter-metal dielectric layer 24 preferably in an array as shown in FIGS. 5a and 5b. A second metal line 26, consisting of copper, overlies the first inter-metal dielectric layer 24. The second metal line 26 is preferably a rectangular ring substantially aligned with the first metal line 16 as shown in FIG. 5d. The first metal plugs 20 and the first metal walls 22 connect with the first metal line 16 and a second metal line 26 in the first inter-metal dielectric layer 24 as shown in FIG. 5a.

Figure 5C:
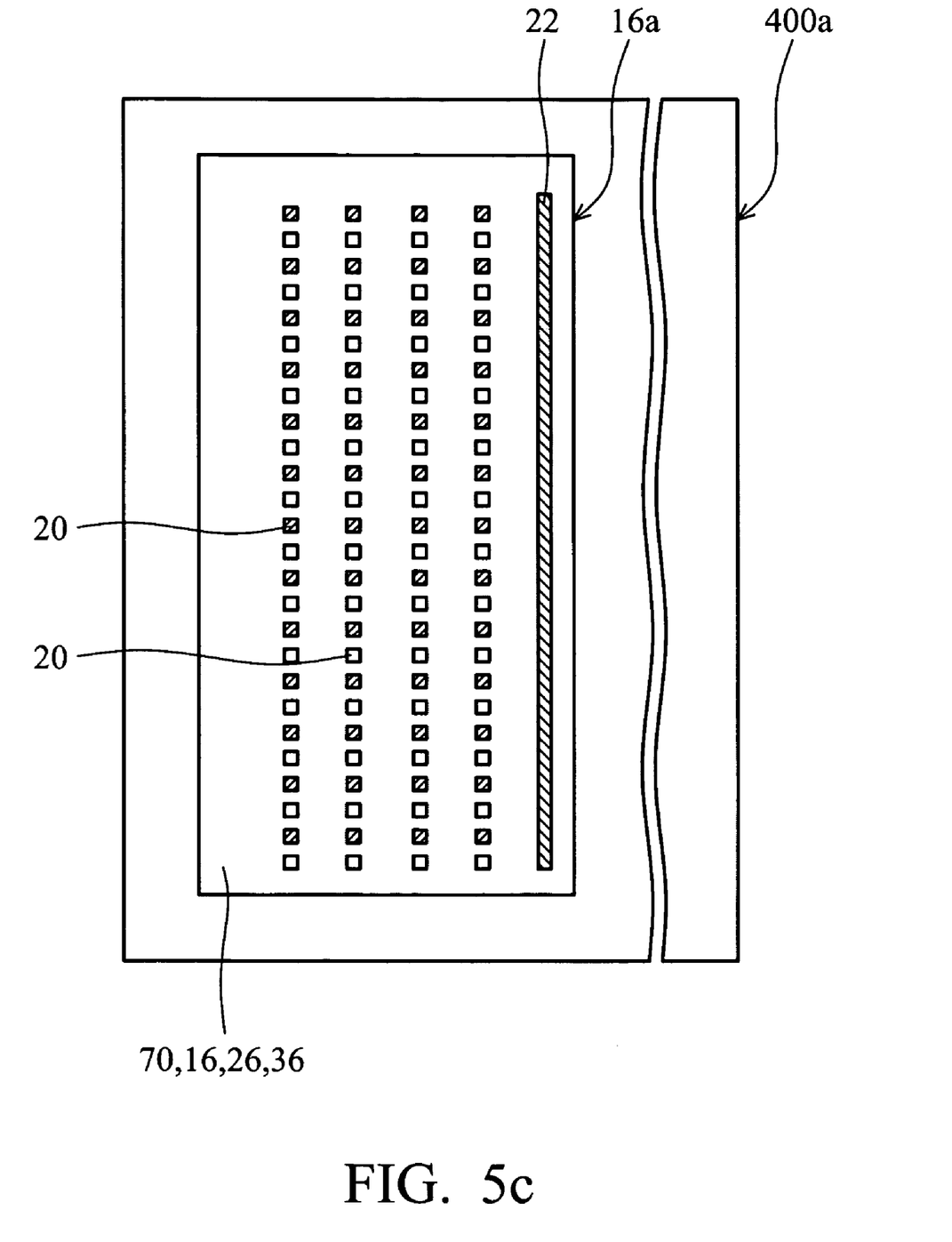
FIG. 5c is top view of another arrangement of inter-layer metal plugs and an inter-layer metal wall.
Figure 5D:
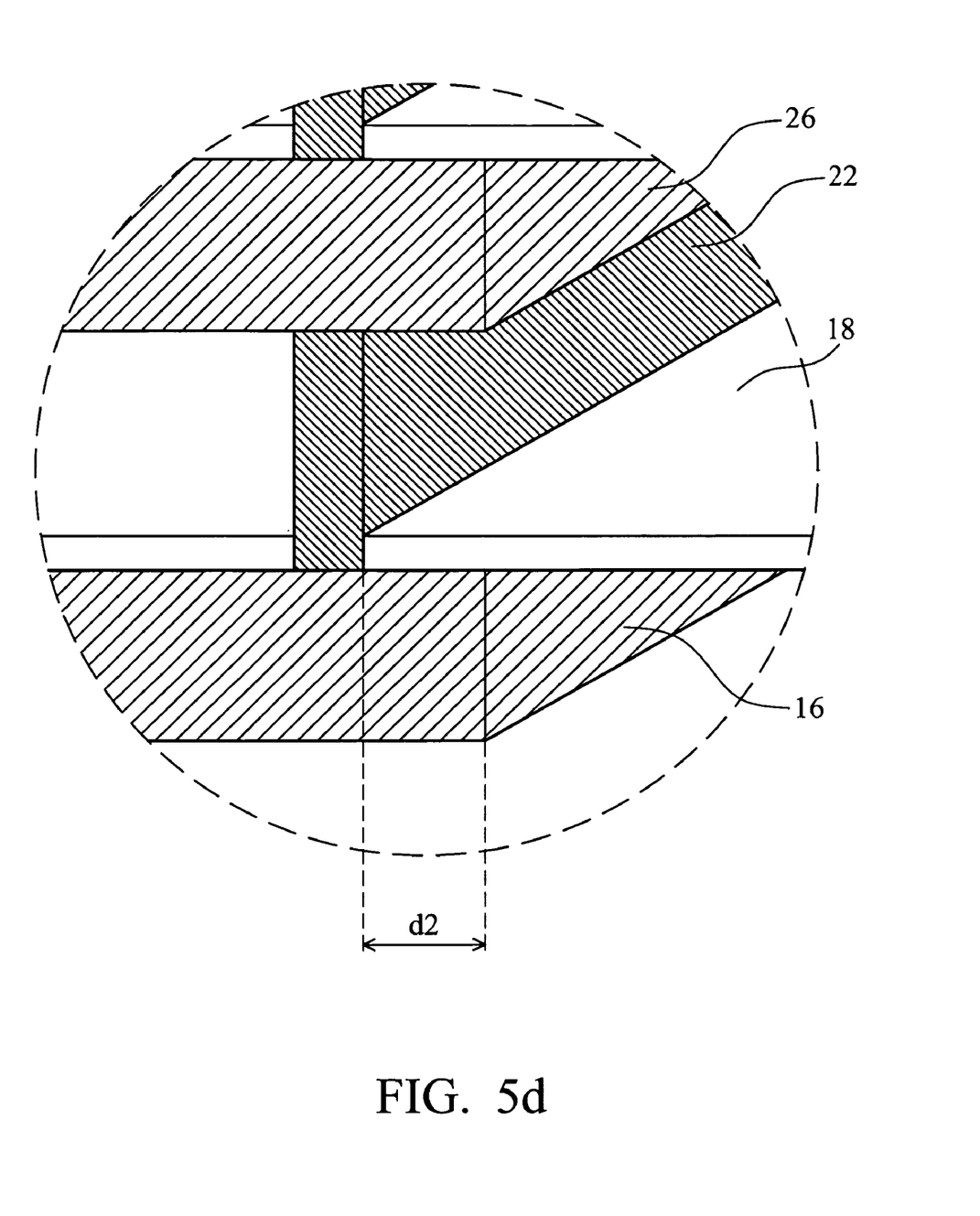
Figure 5E:
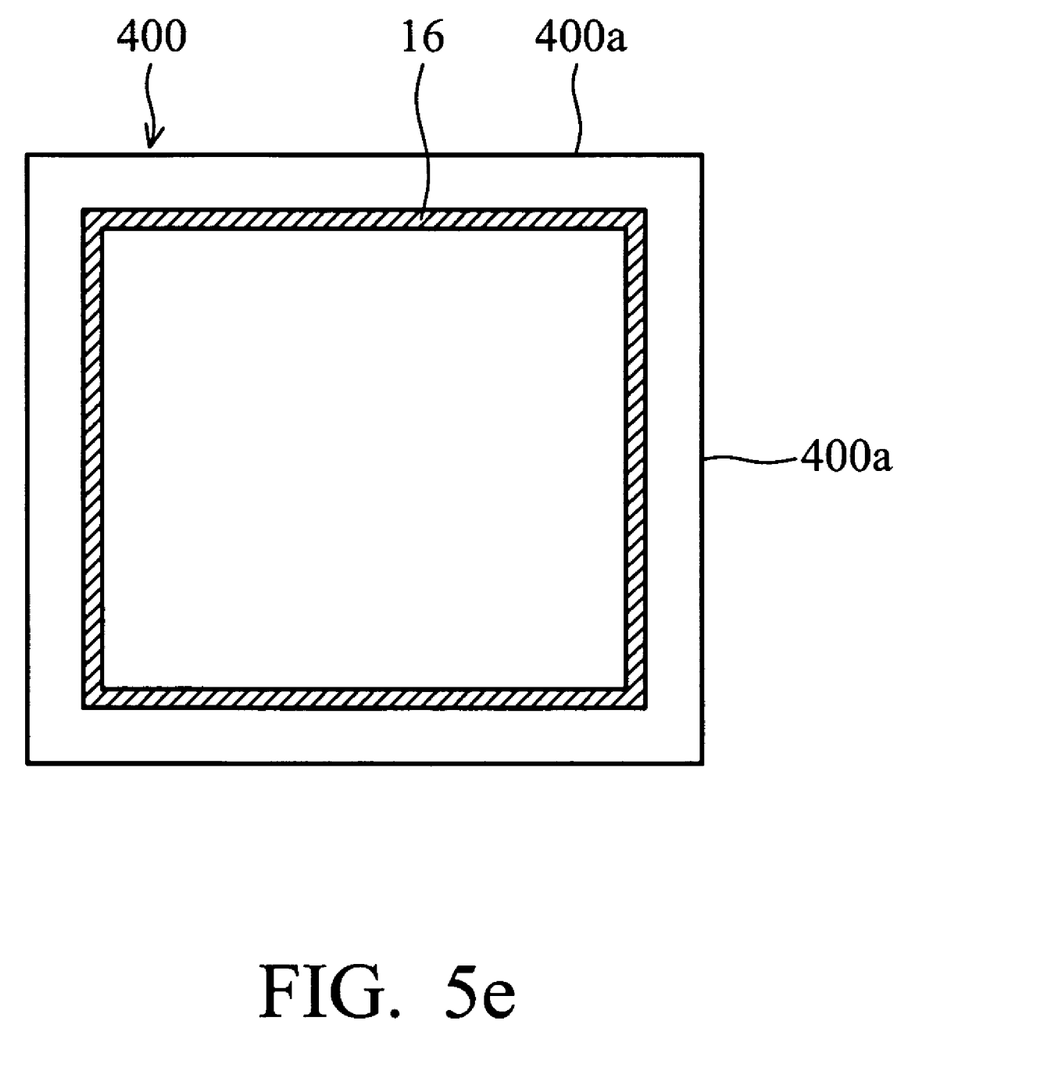
FIG. 5e is a top view of a metal line extending along the periphery of a chip.

Alternately, one first metal wall 22 laterally adjacent to the periphery 16a of the first metal line 16 facing the periphery 400a of the semiconductor chip, as shown in FIG. 5c.

A second etching stop layer 28, comprising for example silicon nitride, on the first inter-metal dielectric layer 24 and second metal line 26 has a second inter-metal dielectric layer 34 with a dielectric constant less than 3.2 thereon whereby the second etching stop layer 28 is between the first metal line 26 and the second inter-metal dielectric layer 34.

The second etching stop layer 28 acts as an end point during etching of the second inter-metal dielectric layer 34 to form via holes for metal plugs and via trenches.

A plurality of second metal plugs 30, consisting of copper, in the second inter-metal dielectric layer 34 are vertically separated from each other by the second inter-metal dielectric layer 34. Second metal walls 32 in the second inter-metal dielectric layer 34 are laterally adjacent to a periphery of the first metal line 26 and substantially aligned with the first metal wall 22 in the first inter-metal dielectric layer 24.

Second metal plugs 30 are disposed in the second inter-metal dielectric layer 34 in an array. The array of the second metal plugs 30 is substantially aligned with the array of the first metal plugs 20 under the second metal plugs 30.

The second metal walls 32 are laterally adjacent to a periphery of the second metal line 26 and connect the second metal line 26 and a third metal line 36 in the second inter-metal dielectric layer 34. The second metal plugs 30 are also connected to the second metal line 26 and the third metal line 36. The third metal line 36, consisting of copper, extends along the periphery of the chip and substantially aligned with the second metal line 26.

A stacked metal structure 80 comprising a plurality of inter-metal dielectric layers, a plurality of metal lines, a plurality of etching stop layers, a plurality of metal plugs, and a plurality of metal walls is formed on the second inter-metal dielectric layer 34. Each array of the metal plugs in individual dielectric layer is preferably aligned with others. Furthermore, top metal plugs 60 and top metal walls are formed in the top dielectric layer 102, and a metal line 70 is formed on the top dielectric layer 102.

Figure 6:
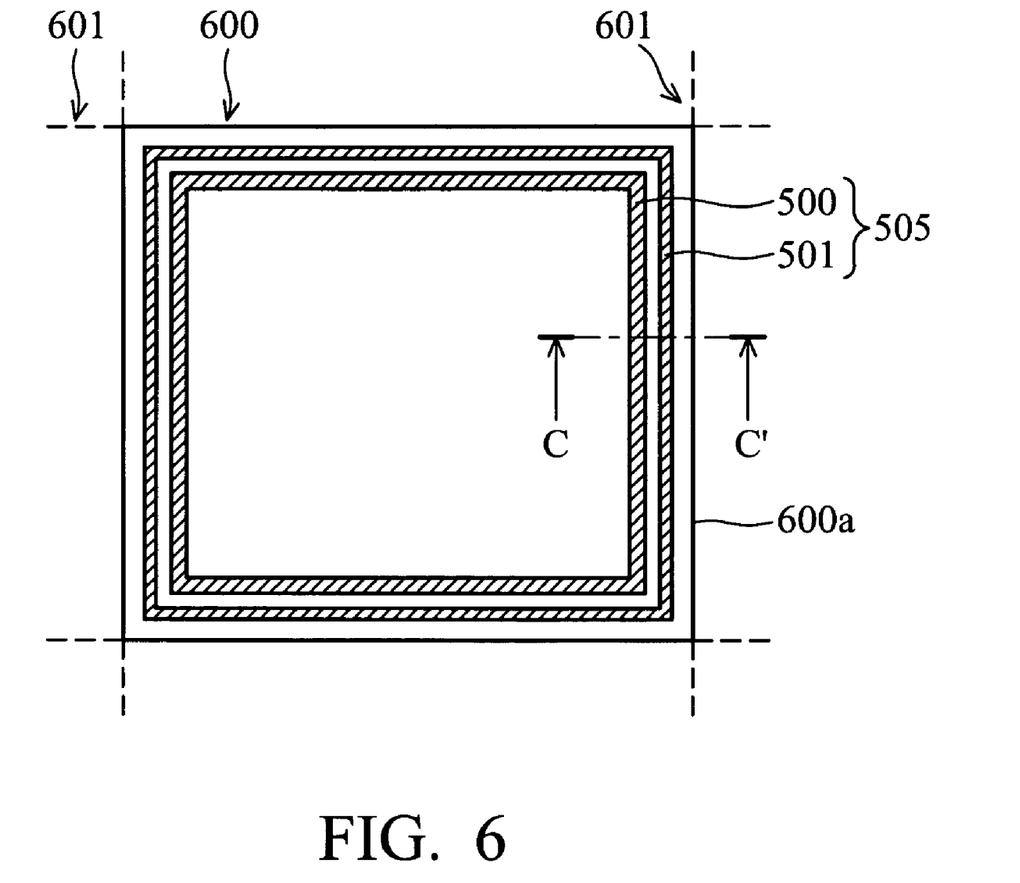
FIG. 6 is a top view of another embodiment of a semiconductor chip with edge seal thereon.
Figure 7:
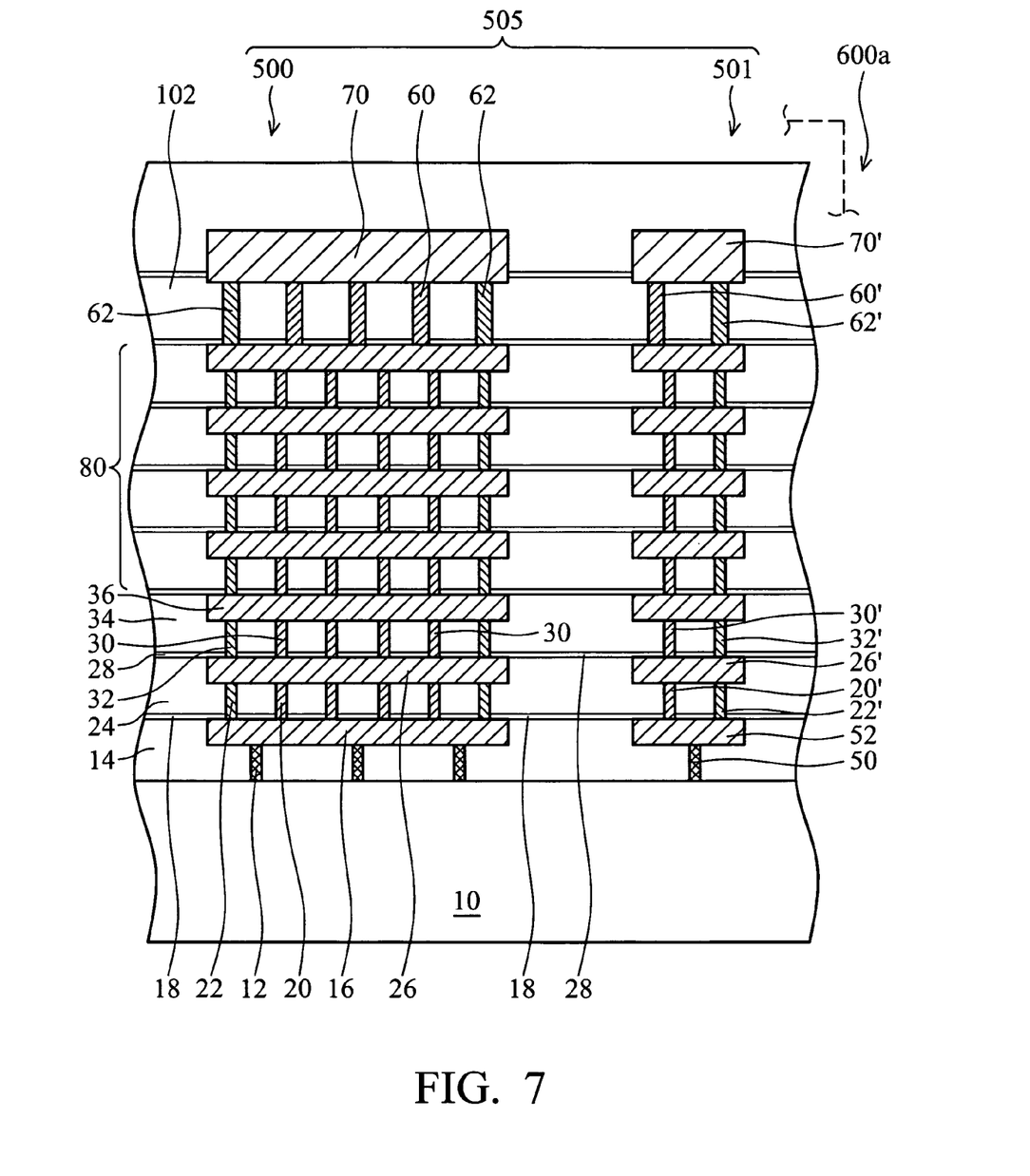
FIG. 7 is a cross sectional view taken along line C–C' of FIG. 6.

Alternately, as shown in FIG. 6 and FIG. 7, the edge seal may comprise an auxiliary edge seal. FIG. 6 is a top view of another embodiment of an integrated circuit device, a semiconductor chip 600, with an edge seal thereon sawn from a wafer along a scribe line 401 with an edge seal 505 comprising a main seal 500 and an auxiliary edge seal 501 disposed surrounding the main seal 500 to ensure protection of integrated circuits against moisture and metal contamination.

FIG. 7 is a cross sectional view taken along line C–C' of FIG. 6 and shows the detailed structures of the edge seal including the main edge seal 500 and the auxiliary edge seal 501.

A semiconductor wafer 10 has a dielectric layer 14 thereon. The dielectric layer 14 comprises a material with a dielectric constant less than 3.2, for example a polymer based dielectric or an inorganic material such as a carbon-doped oxide. A plurality of tungsten plugs 12 and a first metal line 16 comprising copper are within the dielectric layer 14.

A first etching stop layer 18 for example comprising silicon nitride, is formed on the first metal line 16 and the dielectric layer 14. A first inter-metal dielectric layer 24, having a dielectric constant less than 3.2, is disposed on the first etching stop layer 18 such that the first etching stop layer 18 is between the first metal line 16 and the first inter-metal dielectric layer 24. The first etching stop layer 18 acts as an end point during etching of first inter-metal dielectric layer 24 to form via holes for metal plugs and via trenches for metal walls.

Figure 9:
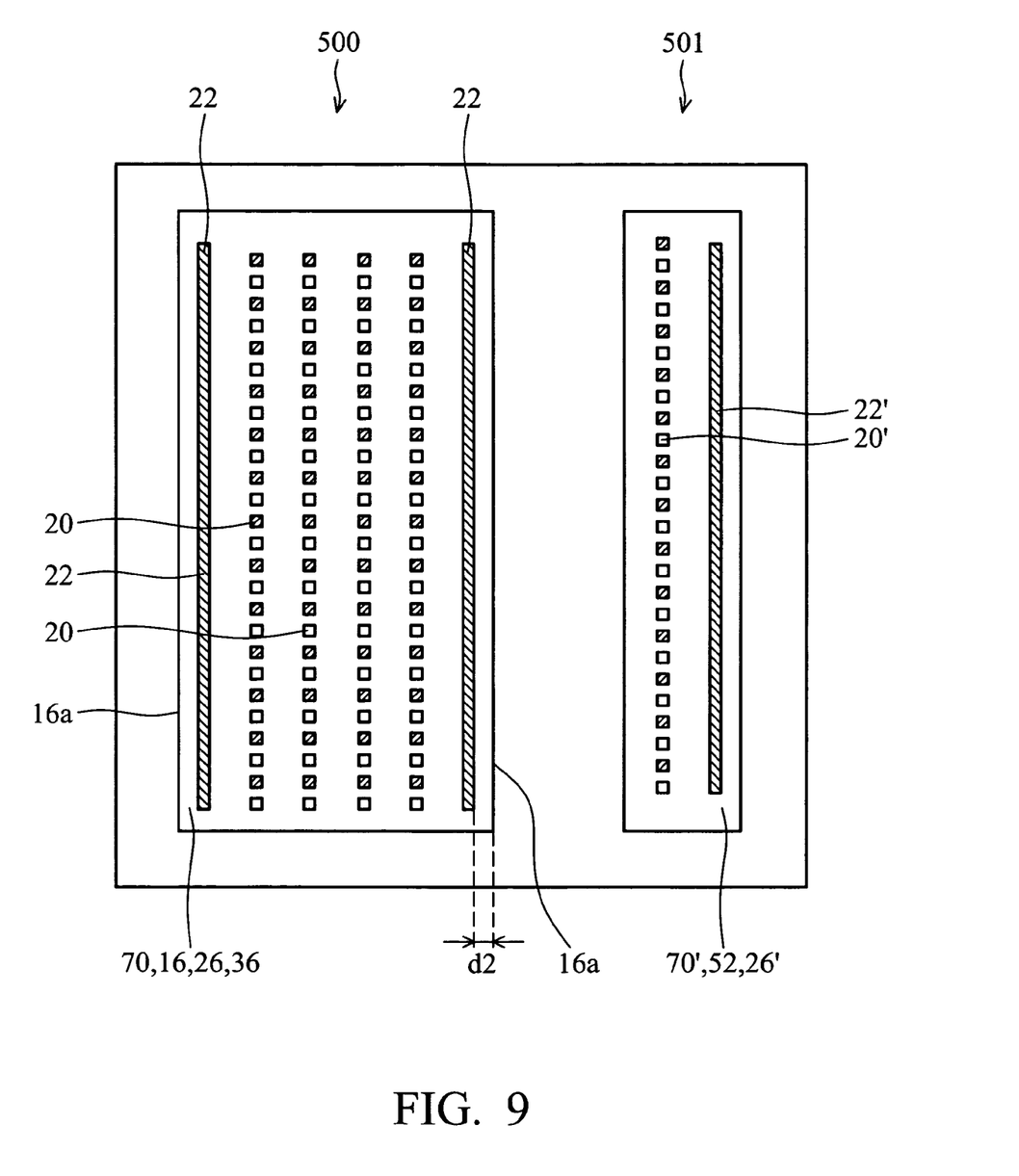
FIG. 9 is a top view of yet another embodiment of the inter-layer metal plugs and the metal walls.

A plurality of first metal plugs 20, consisting of copper, in the first inter-metal dielectric layer 24 are vertically separated from each other by the first inter-metal dielectric layer 24. First metal walls 22 in the first inter-metal dielectric layer 24 are laterally adjacent to a periphery 16a of the first metal line 16 as shown in FIG. 9. Each of the first metal walls 22 is separated by a distance d2 less than 1 micron from the periphery 16a of the first metal line 16.

First metal plugs 20 and first metal wall 22 comprise a copper layer in the via holes and the trenches described above.

A second etching stop layer 28, comprising for example silicon nitride, is on the first inter-metal dielectric layer 24 and second metal line 26 has a second inter-metal dielectric layer 34 with a dielectric constant less than 3.2 thereon whereby the second etching stop layer 28 is between the first metal line 26 and the second inter-metal dielectric layer 34.

The second etching stop layer 28 acts as an end point during etching of the second inter-metal dielectric layer 34 to form via holes for metal plugs and via trenches.

A plurality of second metal plugs 30, consisting of copper, in the second inter-metal dielectric layer 34 are vertically separated from each other by the second inter-metal dielectric layer 34. Second metal walls 32 in the second inter-metal dielectric layer 34 are laterally adjacent to a periphery of the first metal line 26.

Second metal plugs 30 are disposed in the second inter-metal dielectric layer 34 in an array. The array of the second metal plugs 30 is aligned with that of the first metal plugs 20 under the second metal plugs 30 as shown in FIG. 7.

The second metal walls 32 are laterally adjacent to a periphery of the second metal line 26 and connects the second metal line 26 and a third metal line 36 in the second inter-metal dielectric layer 34. The second metal plugs 30 are also connected to the second metal line 26 and the third metal line 36. The third metal line 36, consisting of copper, extends along the periphery of the chip and substantially aligned with the second metal line 26.

A stacked metal structure 80 comprising a plurality of inter-metal dielectric layers, a plurality of metal line, a plurality of etching stop layers, a plurality of metal plugs, and a plurality of metal walls is formed on the second inter-metal dielectric layer 34. Each array of the metal plugs in individual dielectric layer is preferably aligned with others. Furthermore, top metal plugs 60 and top metal walls are formed in the top dielectric layer 102, and a metal line 70 is formed on the top dielectric layer 102.

Furthermore, the auxiliary edge seal 501 is disposed along the periphery 600a of the semiconductor chip 600 and the main seal 500 as shown in FIGS. 6 and 7. The auxiliary edge seal 501 is between the main seal 500 and the periphery 600a of the semiconductor chip 600. The auxiliary edge seal 501 comprises tungsten plugs 50 within the dielectric layer 14, and a fourth metal line 52 between the first metal line 16 and the periphery 600a of the chip. A fifth metal line 26' is formed in the first inter-metal dielectric layer 24 and between the second metal line 26 and the periphery 600a of the chip. A plurality of third metal plugs 20' are formed in the first inter-metal dielectric layer 24 and connected the forth metal line 52 and the fifth metal line 26'. Also, a third metal wall 22' is formed in the first inter-metal dielectric layer and laterally adjacent to a periphery of the fourth metal line 52 and connected the forth metal line 52 and the fifth metal line 26'.

Auxiliary edge seal 501 further comprises metal lines, metal plugs and metal walls formed in each dielectric layer.

Figure 8:
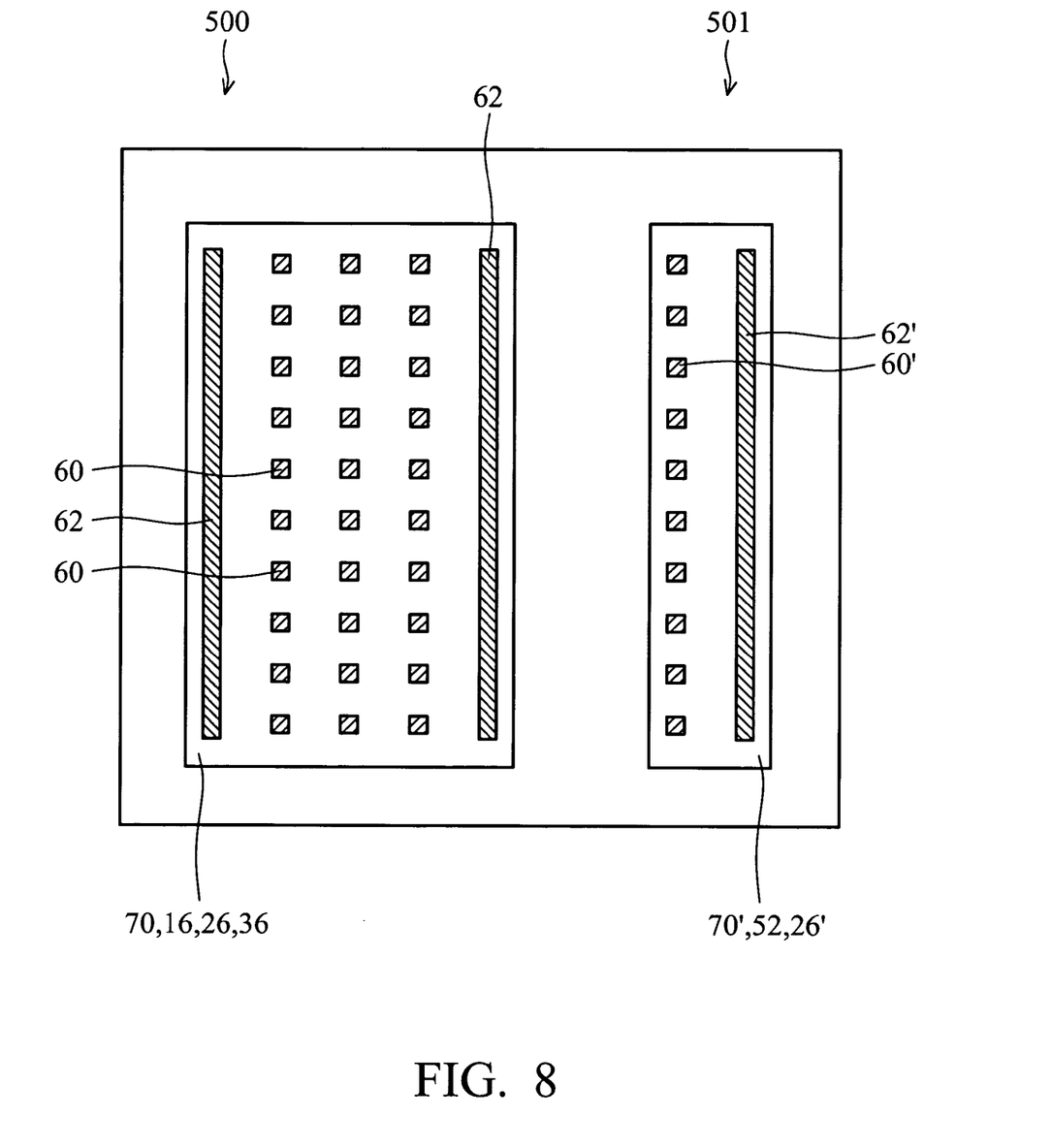
FIG. 8 is a top view of another arrangement of the top metal plugs and the metal wall.

FIG. 8 is a top view of top metal plugs 60 and top metal wall 62. Symbols 70, 16, 26, 36 indicate a projection area of part of the edge seal 500. Symbol 60 indicates the top metal plugs arranged in an array. Symbol 62 indicates the top metal wall which is disposed adjacent to the metal line 70. On the other hand, symbols 70', 52, 26' indicate a projection area of part of the auxiliary edge seal 501. Symbol 60' indicates the top metal plugs of the auxiliary edge seal 501. Symbol 62' indicates the top metal wall of the auxiliary edge seal 501.

FIG. 9 is a top view of the inter-layer metal plugs and the metal walls. Symbols 70, 16, 26, 36 indicate the projection area of part of the main seal 500. Symbol 20 indicates the first metal plugs arranged in an array. Symbol 22 indicates the first metal walls which are disposed adjacent to the first metal line 16 and along the periphery 16a of the first metal line 16. On the other hand, symbols 70', 52, 26' indicate the projection area of part of the auxiliary edge seal 501. Symbol 20' indicates the third metal plugs formed in the inter-layer dielectric layer of the auxiliary edge seal 501. Symbol 22' indicates the inter-layer metal wall of the auxiliary edge seal 501.

The auxiliary edge seal 501 outside the main edge seal 500 further protects integrated circuits in the semiconductor ship 600 from moisture and metal contamination while or after the semiconductor chip is sawn.

The first metal wall may be separated by less than one micron from the periphery of the first metal line and the first metal plugs are arranged in an array rather than a plurality of metal walls. Therefore, delimitation problem in the conventional structure may be solved.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An edge seal for a chip with integrated circuits, comprising:
    a first metal line along a periphery of the chip;
    a first inter-metal dielectric layer on the first metal line;
    a second metal line overlying the first inter-metal dielectric layer and extending along the periphery of the chip;
    a plurality of first metal plugs in the first inter-metal dielectric layer connecting the first metal line and the second metal line; and
    at least one first metal wall in the first inter-metal dielectric layer laterally adjacent to a periphery of the first metal line, in which the first metal wall connects the first metal line and the second metal line.

2. An edge seal for a chip with integrated circuits as claimed in claim 1, further comprising:
    a second inter-metal dielectric layer on the second metal line.

3. An edge seal for a chip with integrated circuits as claimed in claim 2, further comprising:
    a first etching stop layer between the first metal line and the first inter-metal dielectric layer; and
    a second etching stop layer between the second metal line and the second inter-metal dielectric layer.

4. An edge seal for a chip with integrated circuits as claimed in claim 1, wherein the first metal plugs are arranged in an array.

5. An edge seal for a chip with integrated circuits as claimed in claim 1, wherein the first metal line is substantially aligned with the second metal line.

6. An edge seal for a chip with integrated circuits as claimed in claim 1, wherein the first inter-metal dielectric layer has a dielectric constant less than 3.2.

7. An edge seal for a chip with integrated circuits as claimed in claim 1, wherein the first metal plugs are vertically separated from each other by the first inter-metal dielectric layer.

8. An edge seal for a chip with integrated circuits as claimed in claim 1, wherein the first metal line and the second metal line comprise copper.

9. An edge seal for a chip with integrated circuits as claimed in claim 2, further comprising:
    a third metal line overlying the second inter-metal dielectric layer and extending along the periphery of the chip;
    a plurality of second metal plugs in the second inter-metal dielectric layer and connecting the second metal line and the third metal line; and
    at least one second metal wall in the second inter-metal dielectric layer and laterally adjacent to a periphery of the second metal line, in which the second metal wall connects the second metal line and the third metal line.

10. An edge seal for a chip with integrated circuits as claimed in claim 9, wherein the second metal plugs are arranged in an array.

11. An edge seal for a chip with integrated circuits as claimed in claim 9, wherein the third metal line is substantially aligned with the second metal line.

12. An edge seal for a chip with integrated circuits as claimed in claim 9, wherein the second metal plugs are vertically separated from each other by the second inter-metal dielectric layer.

13. An edge seal for a chip with integrated circuits as claimed in claim 9, wherein the third metal line comprises copper.

14. An edge seal for a chip with integrated circuits as claimed in claim 9, wherein the first metal plugs are aligned with the second metal plugs.

15. An edge seal for a chip with integrated circuits as claimed in claim 1, further comprising:
    an auxiliary edge seal along the periphery of the chip dielectrically surrounding the first metal line and the second metal line.

16. An edge seal for a chip with integrated circuits as claimed in claim 15, wherein the auxiliary edge seal is between the first metal line and the periphery of the chip.

17. An edge seal for a chip with integrated circuits as claimed in claim 15, wherein the auxiliary edge seal further comprising:
 a fourth metal line between the first metal line and the periphery of the chip;
 a fifth metal line overlying the first inter-metal dielectric layer and between the second metal line and the periphery of the chip; and
 a plurality of third metal plugs in the first inter-metal dielectric layer and connecting the fourth metal line and the fifth metal line.

18. An edge seal for a chip with integrated circuits as claimed in claim 17, further comprising a third metal wall in the first inter-metal dielectric layer laterally adjacent to a periphery of the fourth metal line.

19. An edge seal for a chip with integrated circuits as claimed in claim 1, wherein the first metal wall is separated apart by a distance less than one micron from the periphery of the first metal line.

20. An integrated circuit device comprising the edge seal according to claim 1.

21. An edge seal for a chip with integrated circuits, comprising:
 a plurality of inter-metal dielectric layers;
 a plurality of metal lines, each formed on the inter-metal dielectric layers and extended along a periphery of the chip;
 a plurality of metal plugs in the inter-metal dielectric layers, in which each of the metal plugs connects two adjacent metal lines;
 a plurality of metal walls formed in the inter-metal dielectric layers, wherein each of the metal walls is formed adjacent to a periphery of the metal lines and connects two adjacent metal lines.

22. An edge seal for a chip with integrated circuits as claimed in claim 21, wherein the metal plugs are arranged in an array in each of the inter-metal dielectric layers.

23. An edge seal for a chip with integrated circuits as claimed in claim 22, wherein the metal plugs in each of the inter-metal dielectric layers are aligned with those in adjacent inter-metal dielectric layers.

24. An edge seal for a chip with integrated circuits as claimed in claim 21, wherein the inter-metal dielectric layers have a dielectric constant of less than 3.2.

25. An edge seal for a chip with integrated circuits as claimed in claim 21, wherein the metal lines comprise copper.

26. An edge seal for a chip with integrated circuits as claimed in claim 23, wherein the metal lines formed in the adjacent inter-metal dielectric layers are substantially aligned with each other.

27. An edge seal for a chip with integrated circuits as claimed in claim 21, wherein the metal plugs comprise copper.

28. An edge seal for a chip with integrated circuits as claimed in claim 21, wherein each of the metal walls is separated apart by a distance less than one micron from the periphery of at least one of the metal lines.

29. An integrated circuit device comprising the edge seal according to claim 21.

30. An edge seal for a chip with integrated circuits, comprising:
 a plurality of inter-metal dielectric layers;
 a plurality of metal lines, each formed on the inter-metal dielectric layers and extended along a periphery of the chip;
 a plurality of metal plugs in the inter-metal dielectric layers, in which each of the metal plugs connects two adjacent metal lines; and
 a plurality of metal walls formed in the inter-metal dielectric layers, wherein the metal walls formed in adjacent inter-metal dielectric layers are substantially aligned with each other.

31. An edge seal for a chip with integrated circuits as claimed in claim 30, wherein the metal plugs are arranged in an array in each of the inter-metal dielectric layers.

32. An edge seal for a chip with integrated circuits as claimed in claim 31, wherein the metal plugs in each of the inter-metal dielectric layers are aligned with those in adjacent inter-metal dielectric layers.

33. An edge seal for a chip with integrated circuits as claimed in claim 30, wherein the inter-metal dielectric layers have a dielectric constant of less than 3.2.

34. An edge seal for a chip with integrated circuits as claimed in claim 30, wherein the metal lines comprise copper.

35. An edge seal for a chip with integrated circuits as claimed in claim 32, wherein the metal lines formed in the adjacent inter-metal dielectric layers are substantially aligned with each other.

36. An edge seal for a chip with integrated circuits as claimed in claim 30, wherein the metal plugs comprise copper.

37. An edge seal for a chip with integrated circuits as claimed in claim 30, wherein each of the metal walls is separated apart by a distance less than one micron from the periphery of at least one of the metal lines.

38. An edge seal for a chip with integrated circuits as claimed in claim 30, wherein each of the metal walls is formed adjacent to a periphery of the metal lines and connects two adjacent metal lines.

39. An integrated circuit device comprising the edge seal according to claim 30.

* * * * *